US 6,696,836 B2

(12) United States Patent
Kimmlingen

(10) Patent No.: US 6,696,836 B2
(45) Date of Patent: Feb. 24, 2004

(54) METHOD FOR THE OPERATION OF A MAGNETIC RESONANCE APPARATUS AND MAGNETIC RESONANCE APPARATUS FOR THE IMPLEMENTATION OF THE METHOD

(75) Inventor: Ralph Kimmlingen, Nuremberg (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/085,344

(22) Filed: Feb. 28, 2002

(65) Prior Publication Data
US 2002/0161297 A1 Oct. 31, 2002

(30) Foreign Application Priority Data
Feb. 28, 2001 (DE) ......................... 101 09 543

(51) Int. Cl.⁷ ................................................ G01V 3/00
(52) U.S. Cl. ...................................... 324/309; 324/318
(58) Field of Search ................................ 324/318, 309, 324/307, 322; 335/299

(56) References Cited

U.S. PATENT DOCUMENTS

| 4,585,995 A | | 4/1986 | Flugan | 324/322 |
|---|---|---|---|---|
| 4,876,510 A | * | 10/1989 | Siebold et al. | 324/318 |
| 4,928,063 A | | 5/1990 | Lampman et al. | 324/307 |
| 4,978,920 A | * | 12/1990 | Mansfield et al. | 324/318 |
| 5,036,282 A | * | 7/1991 | Morich et al. | 324/318 |
| 5,146,197 A | * | 9/1992 | Lowe | 335/299 |
| 5,349,297 A | * | 9/1994 | DeMeester et al. | 324/318 |
| 5,877,629 A | * | 3/1999 | King et al. | 324/309 |
| 5,952,830 A | * | 9/1999 | Petropoulos et al. | 324/318 |
| 6,049,207 A | * | 4/2000 | Petropoulos | 324/318 |
| 6,127,826 A | * | 10/2000 | Thompson et al. | 324/307 |
| 6,144,202 A | * | 11/2000 | Kanazawa et al. | 324/309 |
| 6,278,275 B1 | * | 8/2001 | Petropoulos et al. | 324/318 |
| 6,297,635 B1 | | 10/2001 | Arz et al. | 324/318 |
| 6,313,630 B1 | * | 11/2001 | Ganin et al. | 324/312 |
| 6,323,646 B1 | * | 11/2001 | Zhou et al. | 324/309 |
| 6,342,787 B1 | * | 1/2002 | Petropoulos et al. | 324/320 |
| 6,479,999 B1 | * | 11/2002 | DeMeester et al. | 324/318 |
| 6,501,977 B1 | * | 12/2002 | Kimmlingen | 600/410 |
| 6,538,443 B2 | * | 3/2003 | Morich et al. | 324/318 |
| 2002/0161297 A1 | * | 10/2002 | Kimmlingen | 600/422 |

FOREIGN PATENT DOCUMENTS

| DE | 34 11 222 | 10/1985 |
|---|---|---|
| DE | 199 55 117 | 5/2001 |
| GB | 2 180 943 | 4/1987 |
| GB | 2 354 327 | 3/2001 |

* cited by examiner

Primary Examiner—Diego Gutierrez
Assistant Examiner—Tiffany A. Fetzner
(74) Attorney, Agent, or Firm—Schiff Hardin & Waite

(57) ABSTRACT

In a method for operating a magnetic resonance apparatus, and a magnetic resonance apparatus for implementing the method, the magnetic resonance apparatus having a gradient system containing at least one gradient coil for generating a gradient field at least within an imaging volume, and at least one shield coil operable independently of the gradient coil for generating a shielding field with which the gradient field can be neutralized in a prescribable region, the gradient system is operated in an operating mode wherein the shield coil is operated for intensifying the gradient field within the imaging volume.

30 Claims, 5 Drawing Sheets

METHOD FOR THE OPERATION OF A MAGNETIC RESONANCE APPARATUS AND MAGNETIC RESONANCE APPARATUS FOR THE IMPLEMENTATION OF THE METHOD

BACKGROUND OF THE INVENTION

1. Field of the Invention

The present invention is directed to a method for the operation of a magnetic resonance apparatus with a gradient system containing at least one gradient coil for generating a gradient field at least within an imaging volume and at least one shield coil operable independently of the gradient coil for generating a shielding field with which the gradient field can be counteracted in a prescribable region, and is also directed to a magnetic resonance apparatus for the implementation of the method.

2. Description of the Prior Art

Magnetic resonance technology is a known technique for acquiring images of the inside of the body of an examination subject. Rapidly switched gradient fields that are generated by a gradient system are superimposed in a magnetic resonant apparatus on a static basic magnetic field that is generated by a basic field magnet system. The magnetic resonance apparatus further has a radio-frequency system that emits radio-frequency signals into the examination subject for triggering magnetic resonance signals and that registers the generated magnetic resonance signals, from which magnetic resonance images are produced.

The gradient system contains a gradient coil system and a gradient amplifier and control unit. The gradient coil system usually has three gradient coils. Each of the gradient coils generates a gradient field for a specific spatial direction that, in the desired ideal case, is exclusively formed by a primary field component that is collinear with the basic magnetic field at least within an imaging volume. The main field component has a prescribable gradient that, in the desired ideal case, is of the same magnitude independently of location at every arbitrary point in time, at least within the imaging volume. Since the gradient field is a time-variable magnetic field, this in fact applies for every point in time; however, the intensity of the gradient is variable from one point in time to another. The direction of the gradient is usually permanently prescribed by the design of the gradient coil. As a result of Maxwell's fundamental equations, however, and contrary to the desired ideal case, no gradient coils can be formed that produces only the aforementioned primary field component over the imaging volume. Among other things, at least one accompanying field component that is directed perpendicularly to the primary field component unavoidably accompanies the primary field component.

Appropriate currents are set in the gradient coil for generating the gradient field. The amplitudes of the required currents amount to up to several hundred amperes. The rise and decay rates of the current amount to up to several hundred kA/s. For power supply, the gradient coils are connected to the gradient amplifier and control unit.

The gradient coil system usually is surrounded by conductive structures wherein eddy currents are induced by the activated gradient fields. Examples of such conductor conductive structures are the vacuum vessel and/or cryoshield of the superconducting basic field magnetic system, copper foil of the radio-frequency shielding and the gradient coil system itself. The fields generated by the eddy currents are unwanted because, without counter-measures, they attenuate the gradient field and distort it in terms of its time curve. This leads to degradation of the quality of the magnetic resonance images. Further, the eddy currents induced in the superconducting basic field magnet system cause a heating of the basic magnetic system, so that a considerably increased cooling power must be exerted for maintaining the super-conduction. In the case of a basic field magnetic system with a permanent magnet, the heating as a consequence of the eddy currents leads to an unwanted modification of the properties of the basic magnetic field and, further, the eddy currents can even produce a demagnetization of the permanent magnet.

Such eddy current fields can be compensated to a certain degree by a suitable pre-distortion of a reference current quantity of the gradient coil. With the pre-distortion, however, only eddy current fields can be compensated that image the gradient field similarly in the mathematical sense, i.e. are the same as the gradient field in terms of their spatial course. The principle functioning of such pre-distortion is disclosed in U.S. Pat. No. 4,585,995. The calculation of the pre-distortion is thereby essentially based on the perception that excited and decaying eddy currents can be described by a specific number of exponential functions having different time constants. Transferred to an electrical network for the compensation of eddy current fields, this means that the pre-distortion can be implemented with filters having different limit frequencies. The setting of the time constants or limit frequencies ensues, for example, by an operator who determines the optimum values at the installed magnetic resonance apparatus by step-by-step variation of settings of the pre-distortion and repeated checking. In another embodiment, the setting of the time constants or limit frequencies ensues automatically. The latter is disclosed, for example, in U.S. Pat. No. 4,928,063.

When implementing a sequence, the pre-distortion of the reference current quantity should be continuously implemented during the entire time execution of the sequence. Due to the pre-distortion of the gradient field amplifier and control unit, power reserves must be kept available that generate a higher power and thus resulting in a more costly dimensioning of the gradient amplifier and control unit.

Since, however, the gradient field also produces eddy current fields whose spatial curves are not the same as the gradient field, additional spatial field distortions of a higher order arise. In order to largely compensate these field distortions, actively shielded gradient coils are among the measures utilized. A shield coil belonging to the gradient coil is designed for this purpose such that the gradient field can be neutralized (counteracted) in a prescribable region, usually in a vacuum container surrounding the gradient coil system or a cryoshield of a superconducting basic field magnet system. To this end, the shield coil usually has a lower number of turns than the gradient coil and is interconnected with the gradient coil so that the shield coil has the same current therein as the gradient coil, but flowing in the opposite direction. Further, the shield coil has an attenuating effect on the gradient field in the imaging volume; an attenuation of the actually useful gradient field of up to half in the imaging volume must be accepted. A gradient coil with an appertaining shield coil for neutralizing a gradient field on a defined area is disclosed, for example, in British Specification 2 180 943.

Further, German OS 34 11 222 discloses a magnetic resonance apparatus that has three gradient coils for generating gradient fields and at least one further coil arrangement operable independently of the gradient coils for generating a magnetic field that proceeds in the direction of a basic magnetic field. The further coil arrangement is designed such that the magnetic field changes in a spatially non-linear fashion and such that a superimposition of the magnetic field with the gradient fields yields a defined, time-spatial modification of the magnetic flux density. The further coil arrangement is fashioned such in one embodiment so that the magnetic field has a spatial course that corresponds to a spherical function of the second or third order. In particular, the unwanted eddy current effects caused by the gradient fields can be eliminated with the further coil arrangement.

SUMMARY OF THE INVENTION

An object of the present invention is to provide an improved method for operating a magnetic resonance apparatus as well as a magnetic resonance apparatus for the implementation of the method with which, among other things, high gradient intensities can be achieved.

In the inventive method for operating a magnetic resonance apparatus having a gradient system containing at least one gradient coil for generating a gradient field at least within an imaging volume, and at least one shield coil operable independently of the gradient coil for generating a shielding field with which the gradient field can be neutralized in a prescribable region, the above object is achieved by operating the gradient system in an operating mode wherein the shield coil is operated for intensifying the gradient field within the imaging volume.

Extremely high gradient intensities can be achieved in the imaging volume with this operating mode. This is especially advantageous, for example, for producing a diffusion gradient pulse, that should have an extremely high gradient/time integral with an optimally short time duration. The analogous case applies for a spoiler gradient pulse. It is accepted in this operating mode that the gradient field is not neutralized by the shielding field in the prescribable region. If the prescribable region is, for example, a region of a basic field magnet system or a region of a cryoshield of a superconducting basic field magnet system, then an increased heating of the basic field magnet system in this operating mode is accepted in favor of the high gradient intensities. This heating can be compensated, for example, by increasing the cooling power of a cooling device of the basic field magnet system.

In an embodiment, the gradient coil in this operating mode is operated—with respect to at least one component of eddy current fields—free of compensation and the shield coil is simultaneously operated for compensating at least one component of eddy current fields. The relevant component or components of eddy current fields is/are produced by the gradient field and/or the shielding field and occur within the imaging volume. Because the gradient coil is operated free of compensation, i.e. without a pre-distortion, the gradient coil can be operated with its maximally allowed current amplitude for generating high gradient intensities during an overall duration of, for example, a square-wave-shaped gradient pulse. The shield coil is operated such that the gradient field is intensified in the imaging volume and eddy current fields produced by the gradient and shielding field are simultaneously compensated. To that end, the shield coil is operated with a suitable pre-distortion. The pre-distortion is accomplished, for example, by filtering a quantity that controls the shield coil current. For suppressing eddy current influences that disturb magnetic resonance images, it is adequate in many cases for only one component of eddy current fields to be compensated, the spatial course thereof corresponding to a spherical function of the first order.

In another embodiment, the gradient field is operated in aforementioned operating mode for compensating a part of at least one component of eddy currents. Because only one part of a component of eddy current fields, whose spatial curve, for example, corresponds to a spherical function of the first order, is compensated with the gradient coil, the shield coil can be operated such that at least one further component of eddy current fields can be additionally compensated, whose spatial course corresponds to a spherical function of a higher order.

In a further embodiment, the gradient system is operated in a further operating mode wherein the shield coil is operated for neutralizing the gradient field on the prescribable region. To that end, for example, the shield coil is operated with a current of the opposite direction but equal in magnitude with respect to the gradient. When the prescribable region is the aforementioned region of the gradient field magnet system, then a heating of the basic field magnet system is minimized in the further operating mode due to the neutralization. A good compensation of eddy current fields is likewise achieved. However, the gradient field is attenuated in the imaging volume by the shielding field in exchange.

In another embodiment, a switch is made between the operating conditions in a time sequence, for example within the framework of a sequence. The first operating mode is used during a time segment of the sequence wherein high gradient intensities are required, for example, for diffusion gradients, and the second operating mode is otherwise used. Further, the gradient system can be operated in an at least one further operating mode between the aforementioned first and the second operating modes. Such an intermediate mode can require in that the first operating mode be set for a calculated gradient axis and the second operating mode is simultaneously set for a further calculated gradient axis. If the calculated gradient axes are unequal to the physical gradient axes permanently prescribed by the gradient system, then a conversion from calculated to physical gradient axes automatically leads to the operation of the gradient system with the aforementioned intermediate mode.

DESCRIPTION OF THE PREFERRED EMBODIMENTS

Figure 1:
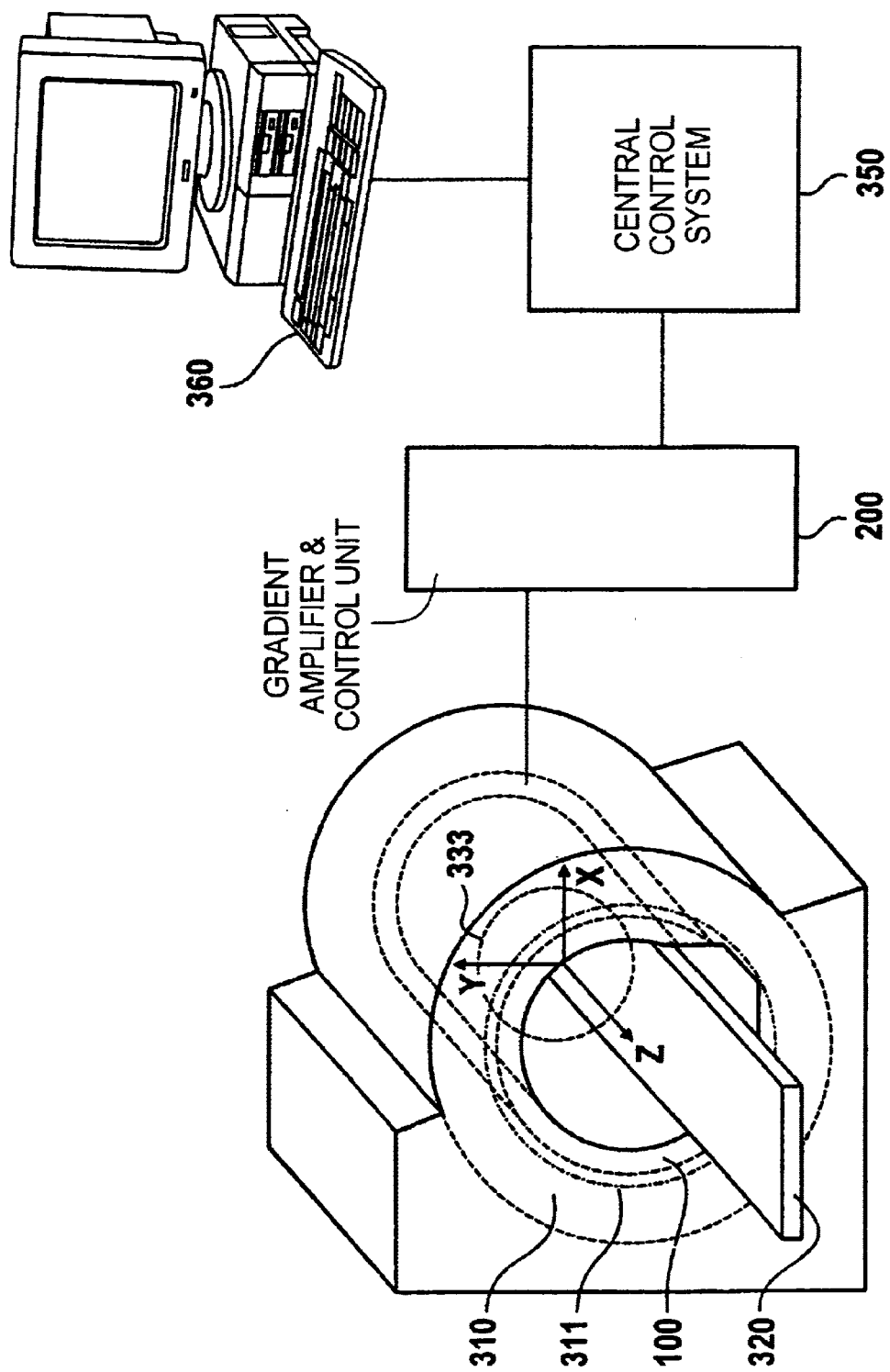
FIG. 1 illustrates the basic components of a magnetic resonance apparatus with a gradient system.

FIG. 1 shows a magnetic resonance apparatus that, for generating an optimally uniform static basic magnetic field at least within an imaging volume 333, has a basic field magnet system 310, and has a gradient system for generating gradient fields that contains a gradient coil system 100 and a gradient amplifier and control unit 200. For controlling currents in the gradient system as a result of a selected sequence, the gradient amplifier and control unit 200 is connected to a central control system 350 that is connected to a display and operating device 360 via which inputs of an operator, for example a desired sequence type and sequence parameters, can be supplied to the central control system 350. A displaceable support mechanism 320 of the apparatus serves, among other things, for positioning a region to be imaged in an examination subject borne on the support mechanism 320 in the imaging volume 333. For clarity, further components of the apparatus, for example a radio-frequency system for emitting radio-frequency signals into a subject, as well as for registering magnetic resonance signals generated as a result, are not shown.

Figure 2:
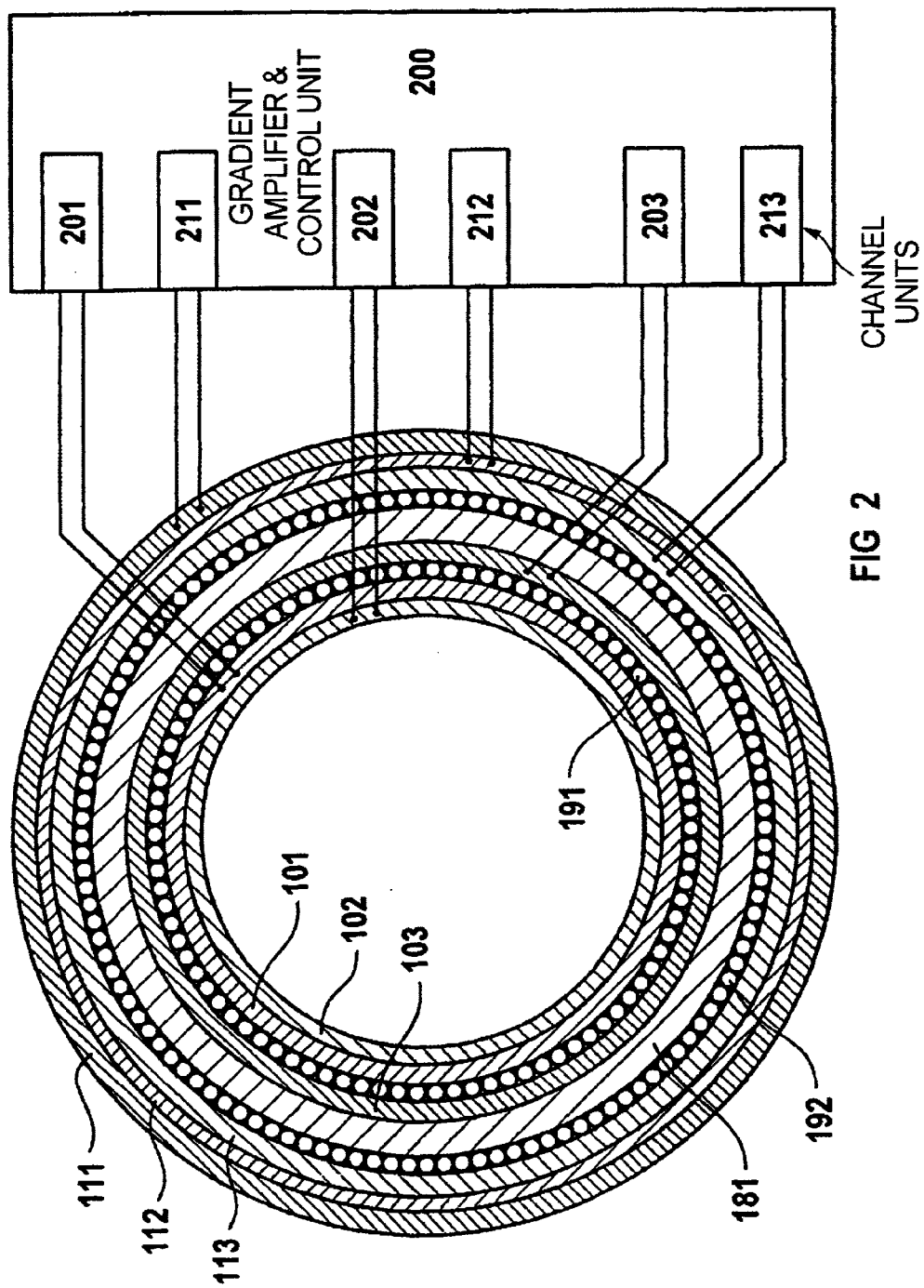
FIG. 2 is a more detailed illustration of the gradient system of FIG. 1.

As an exemplary embodiment of the invention, FIG. 2 shows a detailed illustration of the gradient system from FIG. 1, wherein the gradient coil system 100, which is essentially hollow-cylindrical is shown in a transverse section. The gradient coil system 100 has the following elements from inside to outside, these being fashioned in hollow-cylindrical regions arranged concentrically relative to one another: a first transverse gradient coil 102 for generating a first gradient field having a gradient in the y-direction, a second transverse gradient coil 101 for generating a second gradient field having a gradient in the x-direction, a first cooling device 191, a longitudinal gradient coil 103 for generating a third gradient field having a gradient in the z-direction, a shim assembly 181, a second cooling device 192, a longitudinal shield coil 113 belonging to the longitudinal gradient coil 103 for generating a shielding field, a first transverse shield coil 112 belonging to the first transverse gradient coil 102 for generating a further shielding field, and a second transverse shield coil 111 belonging to the second transverse gradient coil 101 for generating a further shielding field. The shield coils 111 through 113 are thereby fashioned such that a gradient field that can be generated by the appertaining gradient coil 101, 102 or 103 can be neutralized with one of the shield coils 111, 112 or 113 on a prescribable region of the basic field magnet system 310. When the basic field magnet system 310 is a superconducting coil arrangement for generating the basic magnetic field, then the prescribable region is a region of a cryoshield 311 of the basic magnet system 310.

The gradient amplifier and control unit 200 contains six channel units 201 through 213 at whose outputs mutually independent output voltages can be controlled. The channel units 201 through 213 are respectively connected to the coils 101 through 113, so that the individual coils 101 through 113 can be operated with independently controllable currents.

A spatial course of one of the gradient fields or of one of the shield fields can be described by a magnetic flux density $B(r, \theta, \Phi)$ corresponding to a spherical function series according to the following equations:

$$B(r, \theta, \varphi) = \sum_{l=0}^{\infty} \sum_{m=-1}^{+1} A_{(l,m)} \cdot r^l \cdot Y_{(l,m)}(\theta, \varphi) \text{ with}$$

$$Y_{(l,m)}(\theta, \varphi) = \begin{cases} P_{(l,m)}(\cos\theta) \cdot \cos(m\varphi) & m = 0, 1, 2, \ldots, 1 \\ P_{(l,|m|)}(\cos\theta) \cdot \sin(|m|\varphi) & m = -1, -2, \ldots, -1 \end{cases}$$

$A_{(l,m)}$ is referred to as the spherical coefficient with a suitable normalization. The radius r as well as the angles θ and φ, as spherical coordinates proceeding from the origin, describe a point of the three-dimensional space. The origin is thereby generally fixed in the center of the gradient coil system. $P_{(l,m)}(\cos \theta)$ and $P_{(l,|m|)}(\cos \theta)$ are Legendres polynomials, or functions dependent on cos θ.

Due to its system properties forth magnetic flux density in the inside of the coil, only coefficients $A_{(l,m)}$ having an odd-numbered l and, in particular, having m=0 occur at the longitudinal gradient coil 103. Only the coefficients $A_{(l,m)}$ having an odd-numbered l and odd-numbered m are of significance at one of the transverse gradient coils 101 and 102 due to their system properties. The following table illustrates this, the coefficients $A_{(l,m)}$ that are important in practice as well as their significance for the longitudinal and for the transversal gradient coils 103, 101 and 102.

| longi-tudinal | transversal | Significance |
|---|---|---|
| $A_{(1,0)}$ | $A_{(1,1)}$ | Gradient Field |
| $A_{(3,0)}$ | $A_{(3,1)}; A_{(3,3)}$ | Disturbance of the 3rd order |
| $A_{(5,0)}$ | $A_{(5,1)}; A_{(5,3)}; A_{(5,5)}$ | Disturbance of the 5th order |
| $A_{(7,0)}$ | $A_{(7,1)}; A_{(7,3)}; A_{(7,5)}; A_{(7,7)}$ | Disturbance of the 7th order |
| $A_{(9,0)}$ | $A_{(9,1)}; A_{(9,3)}; A_{(9,5)}; A_{(9,7)}; A_{(9,9)}$ | Disturbance of the 9th order |

Other than the coefficient $A_{(1,0)}$, all other coefficients $A_{(l,m)}$ are equal to zero for an ideal longitudinal gradient coil. Other than the coefficient $A_{(1,1)}$, all other coefficients $A_{(l,m)}$ are equal to zero for an ideal transversal gradient coil.

As a result of the gradient and shielding fields that are activated, eddy currents are produced in electrically conductive parts of the basic field magnet system 310 that lead to eddy current fields. Corresponding to gradient and shielding fields, a spatial course of an eddy current field can be described by a magnetic flux density corresponding to a spherical function development. The eddy current field is dependent on the gradient and shielding fields. The eddy current field is produced by a time variation of the magnetic flux density of the gradient and/or shielding field. A time behavior of the eddy current field during a time segment of the aforementioned time variation as well as during a time segment following immediately thereupon, during which no time variation of the gradient and/or shielding field occurs and the previously excited eddy current fields merely decay, can be described by exponential functions in conjunction with time constants characteristic of the exponential function. The time constants for different coefficients of the eddy current field can be different.

The above is taken into consideration in the pre-distortion by, for example with exponential filters, a pre-distorting current/time curve forth gradient and/or shield coils 101 through 113 such that the reactions of the eddy current fields on the gradient and/or shielding fields are compensated. In one embodiment, for example, five time constants per gradient coil 101 through 103 are taken into consideration, these typically lying in a region between 1 ms and 1 s.

Figure 3:
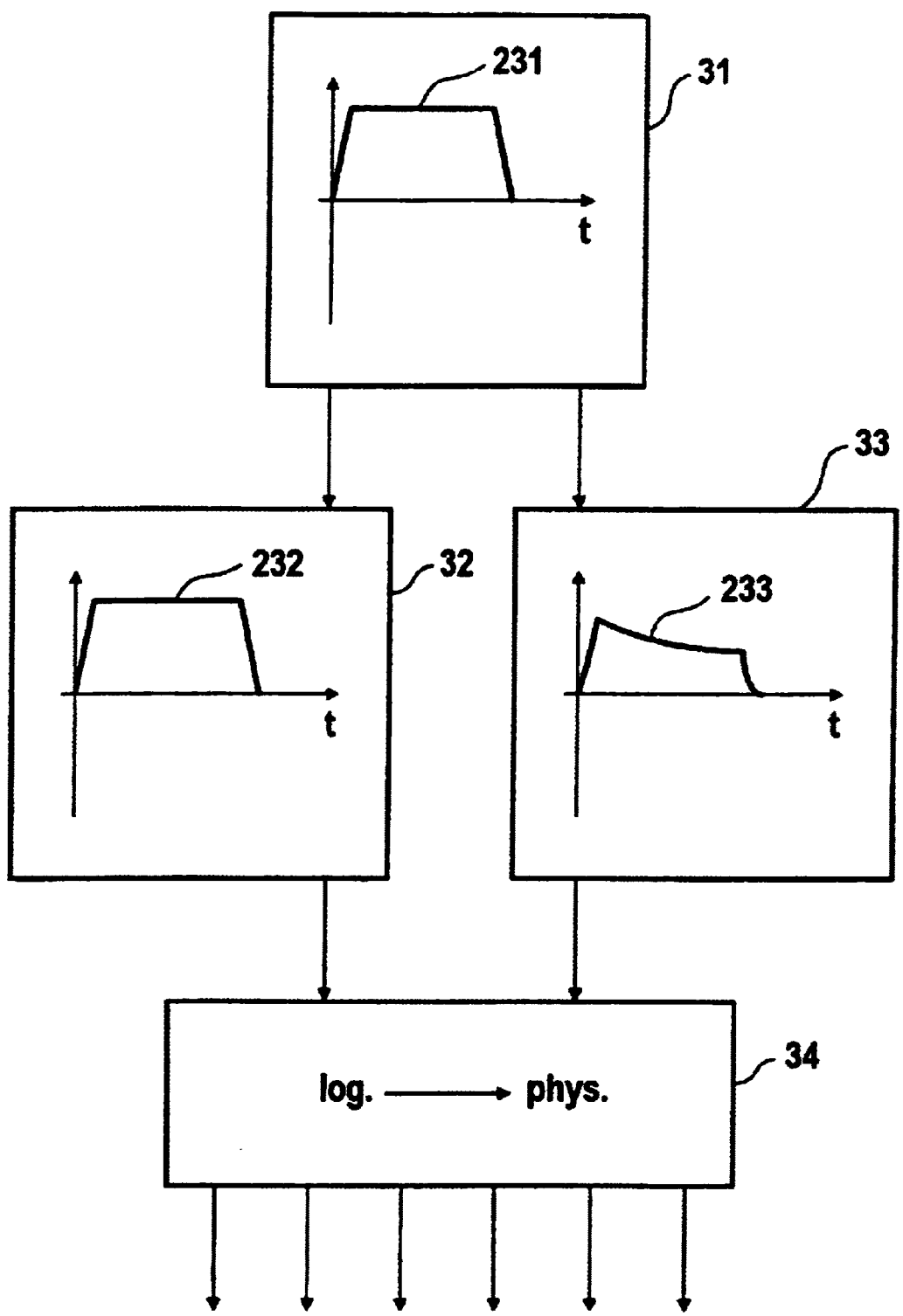
FIG. 3 is a flow chart for the operation of a magnetic resonance apparatus in a first operating condition in accordance with the invention.

As an exemplary embodiment of the invention, FIG. 3 shows a flow chart of a method for operating a magnetic resonance apparatus according to a first operating mode. As an example, the magnetic resonance apparatus shown in FIGS. 1 and 2 is used. In the first operating condition, at least one of the gradient fields is intensified in the imaging volume 333 by at least one of the shielding fields. In the simple case, at least one of the gradient coils 101 through 103 is thereby operated free of a compensation with respect to eddy current fields, and at least one of the shield coils 111, 112 or 113 is operated for compensating a component of eddy current fields having a spatial course corresponding to a spherical function of the first order. In the complex case, in contrast, the gradient coil 101, 102 or 103 is operated for partial compensation of at least one component of eddy current fields, and the shield coil 111, 112 or 113 is operated for the compensation of a number of components of eddy current fields having spatial courses corresponding to spherical functions of at least two orders. For suppressing magnetic resonance image-disturbing eddy current influences, the simple case is adequate in many instances. For a simple explanation, the simple case shall be considered first during the further description of FIG. 3.

In Step 31, for example within the framework of a sequence for a logical gradient axis, a trapezoidal gradient pulse 231 is prescribed that, for example, is to be implemented with a maximum gradient intensity for realizing a diffusion gradient pulse. Taking the first operating mode into consideration, a conversion of the gradient pulse 231 for the gradient coils 101 through 103 at one side and for the shield coils 111 through 113 at the other side ensues in the steps 32 and 33. In the simple case without a pre-distortion, a gradient pulse 232 for the gradient coils 101 through 103 remains essentially unmodified compared to the gradient pulse 231 because no compensation of eddy current fields should ensue with the gradient fields. For achieving an optimally high gradient intensity, the gradient pulse 232 is fashioned such that it largely exploits a performance capability of the gradient coils 101 through 103 as well as of the channel units 201 through 203 connected to the gradient coils 101 through 103. A gradient pulse 233 for the shield coils 111 through 113 is designed such that it acts in an intensifying fashion in view of the gradient fields within the imaging volume. Further, it is designed such that the eddy current fields produced by it and the gradient pulse 232 are simultaneously compensated, whereby, according to the simple case, only one component of the eddy current fields whose spatial course corresponds to a spherical function of the first order is compensated. To that end, the gradient pulse 233 is pre-distorted according to the time constants that are allocated to the eddy current field components of the first order. Before forwarding the gradient pulses 232 and 233 to the channel units 201 through 213, and thus to the gradient coil system 100, a conversion of the gradient pulses 232 and 233 finally ensues from the calculated gradient axis onto the physical gradient axis of the gradient and shield coils 101 through 113. The aforementioned Steps 32 through 34 can be implemented in the central control system 350 but are preferably implemented in the gradient amplifier and control unit 200.

The complex case proceeds essentially analogously in the complex case. The respectively allocated time constants are taken into consideration in the pre-distortion with respect to the respective order only when compensating components of eddy current fields who spatial courses correspond to spherical functions of different orders. For achieving a best-possible compensation for all components of eddy current fields based on the aforementioned spherical function series for the gradient, shielding and eddy current fields, the gradient pulses 232 and 233 are thereby defined using an optimization method, taking the different time constants into consideration. The optimization method disclosed in German OS 199 55 117, corresponding to co-pending application Ser. No.09/712,726 filed Nov. 15, 2000, the teachings of which are incorporated herein by reference.

Figure 4:
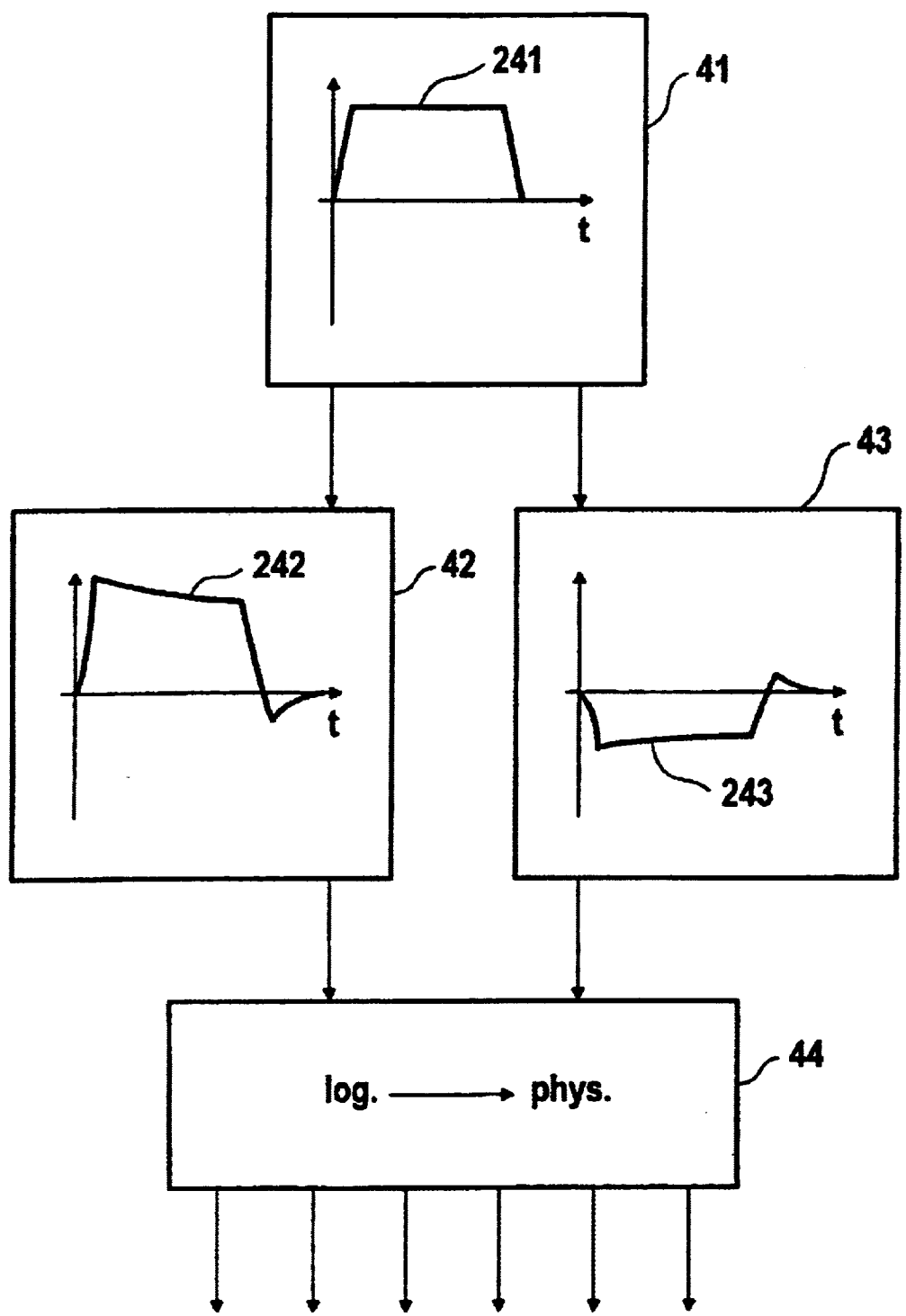
FIG. 4 is a flow chart for operating the magnetic resonance apparatus in a second operating condition in accordance with the invention.

FIG. 4 shows a flow chart for a method for operating a magnetic resonance apparatus according to a second operating mode. The magnetic resonants apparatus shown in FIGS. 1 and 2 is again used as an example. In the second operating mode, the shield coils 111 through 113 are operated in the conventional way for neutralizing gradient fields on the prescribable region. However, the gradient fields are simultaneously attenuated in the imaging volume 333. In a corresponding embodiment of the shield coils 111 through 113, the shield coils 111 through 113 are operated—with respect to an appertaining gradient coil 101 through 103—with a current of the opposite direction but equal in magnitude.

In the flow chart of FIG. 4, a trapezoidal gradient pulse 241 is prescribed in a first step 41 for a calculated gradient axis. Taking the second operating mode into consideration, a conversion of the gradient pulse 241 for the gradient coils 101 through 103 on one side and for the shield coils 111 through 113 on the other side ensues in Steps 42 and 43. A gradient pulse 242 for the gradient coils 101 through 103 as well as a gradient pulse 243 for the shield coils 111 through 113 are identically pre-distorted, so that an optimally optimum compensation in view of eddy current fields arises both for the gradient fields as well as for the shield fields. Before forwarding the gradient pulses 242 and 243 to the channel units 201 through 213 and thus through the gradient coil system 110, a conversion of the gradient pulses 242 and 243 from the calculated gradient axis onto the physical axes of the gradient and shield coils 101 through 113 ultimately ensues in a Step 44. The aforementioned Steps 42 through 44 can be implemented in the central control system 350 but are preferably implemented in the gradient amplifier and control unit 200.

It should be noted that the pre-distortion in the first operating mode is usually more intensely expressed compared to the second operating mode because eddy current fields produced both by the gradient fields as well as by the shielding fields are compensated with the shield coils 111 through 113 in the first operating mode and because no field neutralization occurs in the prescribable region, as a result of which eddy currents are excited with higher intensity and in larger regions of the basic field magnet system 310.

In addition to that set forth above, further field properties of an appertaining gradient field can be varied, for example taking a stimulation threshold of a living examination subject into consideration, given use of a gradient having at least two sub-coils that can be operated independently of one another. A suitably designed gradient amplifier and control unit is utilized for an operation of the sub-coils independently of one another. Further details with respect thereto are disclosed in the aforementioned German OS 199 55 117 (corresponding to co-pending application Ser. No. 09/712, 726). To avoid at least three further channels having to be provided given the gradient amplifier and control unit 200 of FIG. 2, one of two sub-coils 408 and 409 of a gradient coil 403 is connected permanently in series with a shield coil 413.

Figure 5:
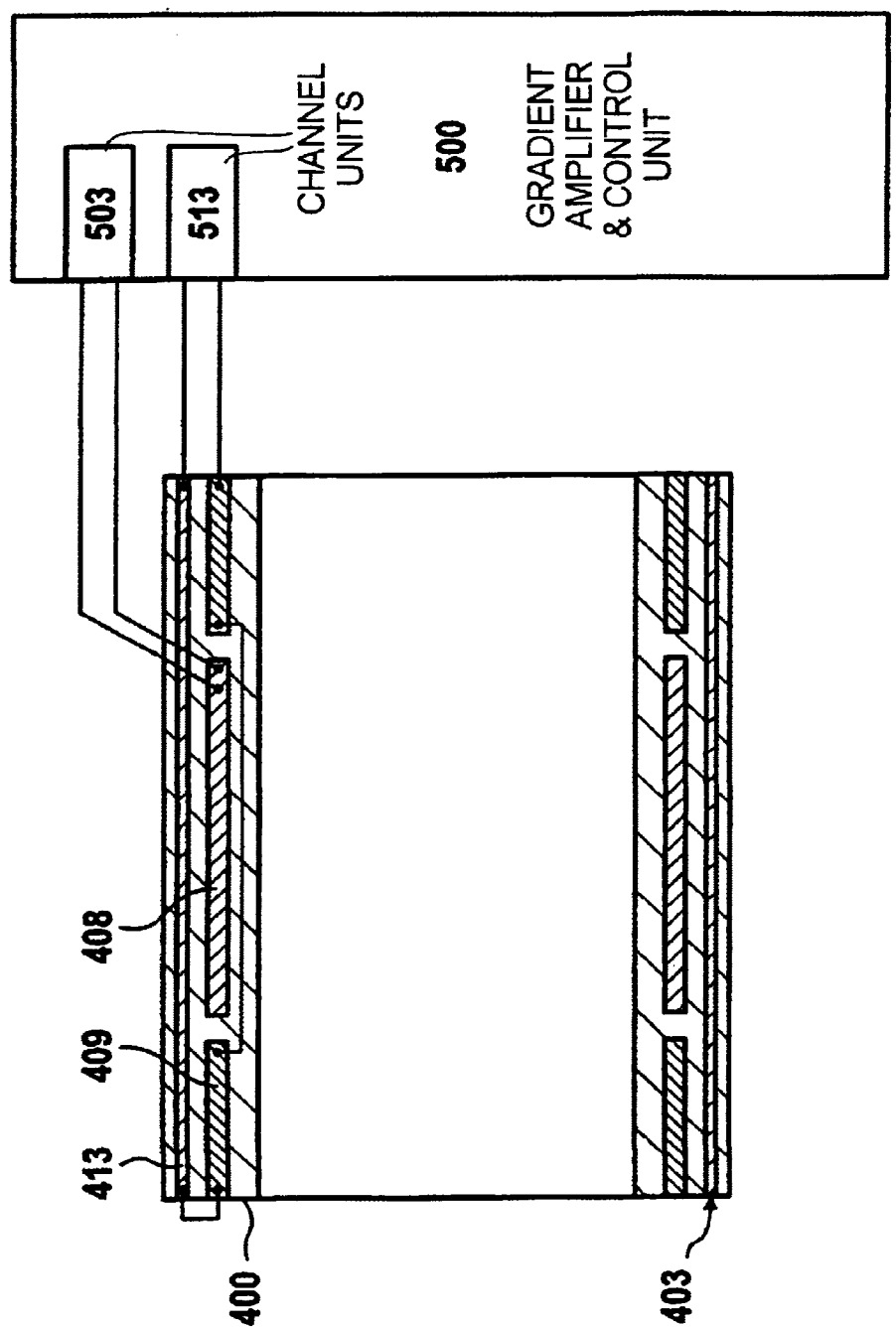
FIG. 5 illustrates a gradient system with a gradient coil that has two sub-coils.

FIG. 5 shows a longitudinal section of a gradient coil system 400 that has a longitudinal gradient coil 403 composed of a first sub-coil 408 and a second sub-coil 409 and comprises a shield coil 413 belonging to the gradient coil 403. The sub-coil 409 and the shield coil 413, which are permanently connected in series, are connected to a channel unit 513 of a gradient amplifier and control unit 500. The sub-coil 409 is interconnected with the shield coil 413 so that the coils 409 and 413 generate magnetic fields within an imaging volume of a magnetic resonance apparatus that act opposite one another. The sub-coil 408 is connected to a further channel unit 503 that can be driven independently of the channel unit 513.

In the second operating mode, the two channel units 503 and 513 are driven with the same current/time signal, this corresponding to a conventional operation of an actively shielded gradient coil.

In the first operating mode, the shielding coil 413 is operated for intensifying a gradient field that can be generated with the sub-coil 408, whereby a compensation of at least one component of eddy current fields is simultaneously implemented with the shield coil 413. The fact that the sub-coil 409 is co-operated in a manner that is inherently unwanted is of no consequence because only a linearity volume of the gradient field generated by the sub-coil 408 is utilized in this operating condition, and the sub-coil 409 essentially develops its effect outside this volume. The arrangement of FIG. 5 can be utilized, for example, in order to vary the linearity volume, and thus further properties of a gradient field in continuous fashion.

Further, the above-described method can be correspondingly applied for the operation of a magnetic resonance apparatus according to the first operating condition given an embodiment wherein a shield coil is designed for generating a magnetic field having a spatial curve corresponding to at least one spherical function.

Although modifications and changes may be suggested by those skilled in the art, it is in the intention of the inventor to embody within the patent warranted hereon all changes and modifications as reasonably and properly come within the scope of his contribution to the art.

I claim as my invention:

1. A method for operating a magnetic resonance apparatus comprising the steps of:
   providing a gradient system having at least one gradient coil operable for generating a gradient field at least within an imaging volume, and at least one shield coil operable independently of said gradient coil, said shield coil being available for generating a shielding field for neutralizing said gradient field in a prescribable region; and
   operating said gradient system in an operating mode including operating said gradient coil to generate said gradient field at least within said imaging volume and operating said shield coil to intensify said gradient field within said imaging volume.

2. A method as claimed in claim 1 comprising operating said gradient coil in said operating mode to generate at least one diffusion gradient.

3. A method as claimed in claim 1 comprising operating said shield coil in said operating mode for compensating at least one component of an eddy current field.

4. A method as claimed in claim 3 comprising operating said gradient coil in said operating mode with no compensation for any component of said eddy current field.

5. A method as claimed in claim 3 comprising operating said shield coil in said operating mode for compensating said at least one component of said eddy current field by supplying said shield coil with a current that is pre-distorted for compensating said at least one component of said eddy current field.

6. A method as claimed in claim 3 comprising operating said shield coil in said operating mode to compensate for at least one component of an eddy current field generated by at least one of said gradient field and said shielding field.

7. A method as claimed in claim 3 comprising operating said shield coil in said operating mode to compensate for at least one component of an eddy current field within said imaging volume.

8. A method as claimed in claim 3 comprising operating said shield coil in said operating mode to compensate for at least one component of an eddy current field having a spatial course corresponding to a spherical function.

9. A method as claimed in claim 3 comprising operating said shield coil in said operating mode to compensate for at least one component of an eddy current field having a spatial course corresponding to a spherical function of the first order.

10. A method as claimed in claim 3 comprising operating said gradient coil in said operating mode for compensating a part of at least one component of an eddy current field.

11. A method as claimed in claim 10 comprising operating said gradient coil in said operating mode with a current that is pre-distorted for compensating said part of said at least one component of said eddy current field.

12. A method as claimed in claim 10 comprising operating said gradient coil in said operating mode to compensate for a part of at least one component of an eddy current field produced by at least one of said gradient field and said shielding field.

13. A method as claimed in claim 10 comprising operating said gradient coil in said operating mode for compensating a part of at least one component of an eddy current field in said imaging volume.

14. A method as claimed in claim 10 comprising operating said gradient coil in said operating mode to compensate for a part of at least one component of an eddy current field corresponding to a spherical function.

15. A method as claimed in claim 10 comprising operating said gradient coil in said operating mode to compensate for a part of at least one component of an eddy current field corresponding to a spherical function of the first order.

16. A method as claimed in claim 1 wherein said operating mode is a first operating mode, and comprising the additional step of operating said gradient system in a second operating mode wherein said shield coil is operated for neutralizing said gradient field in said prescribable region.

17. A method as claimed in claim 16 comprising operating said gradient coil in said second operating mode with a gradient coil current and operating said shield coil in said second operating mode with a shield coil current flowing in an opposite direction to said gradient coil current and having a magnitude equal to a magnitude of said gradient coil current.

18. A method as claimed in claim 16 wherein said magnetic resonance apparatus has a basic field magnet system and wherein the step of operating said gradient system in said second operating mode comprises operating said shield coil to neutralize said gradient field in a region of said basic field magnet system, as said prescribable region.

19. A method as claimed in claim 18 wherein said basic field magnet system has a cryoshield, and wherein the step of operating said gradient system in said second operating mode comprises operating said shield coil to neutralize said gradient field in a region of said cryoshield, as said prescribable region.

20. A method as claimed in claim 16 comprising the additional step of operating said gradient system in at least one further operating mode between said first operating mode and said second operating mode.

21. A method as claimed in claim 16 comprising the additional step of switching operation of said gradient system between said first operating mode and said second operating mode according to a time sequence.

22. A magnetic resonance apparatus comprising:
   a gradient coil operable for generating a gradient field within an imaging volume;
   a shield coil operable to generate a shielding field which neutralizes said gradient field in a prescribable region; and
   a gradient amplifier and control unit connected to said gradient coil and to said shield coil for operating said gradient coil and said shield coil in an operating mode wherein said gradient coil generates said gradient field and wherein said shield coil intensifies said gradient field within said imaging volume.

23. A magnetic resonance apparatus as claimed in claim 22 wherein said operating mode is a first operating mode and wherein said gradient amplifier and control unit operates said gradient coil and said shield coil in a second operating mode wherein said shield coil generates said shielding field to neutralize said gradient field in said prescribable region.

24. A magnetic resonance apparatus as claimed in claim 23 wherein said gradient amplifier and control unit operates said gradient coil and said shield coil in a further operating mode which is intermediate between said first operating mode and said second operating mode.

25. A magnetic resonance apparatus as claimed in claim 22 wherein said gradient coil comprises a first sub-coil and a second sub-coil and wherein said gradient amplifier and control unit supplies respective currents in said operating mode to said first sub-coil and to said second sub-coil independently of each other.

26. A magnetic resonance apparatus as claimed in claim 25 wherein one of said first sub-coil and said second sub-coil is connected in series with said shield coil.

27. A magnetic resonance apparatus as claimed in claim 25 wherein said first sub-coil has a coil design adapted to produce a predetermined linearity characteristic of said gradient field selected from the group consisting of a predetermined linearity volume and a predetermined linearity, and wherein said second sub-coil has a coil designed adapted for varying said linearity characteristic.

28. A magnetic resonance apparatus as claimed in claim 25 wherein said first sub-coil has a coil design for producing a predetermined gradient intensity of said gradient field in said operating mode, and wherein said second sub-coil is an amplifier coil for varying said predetermined gradient intensity.

29. A magnetic resonance apparatus as claimed in claim 28 wherein said first sub-coil has a coil design for generating a maximum gradient intensity for said first sub-coil, as said predetermined gradient intensity.

30. A magnetic resonance apparatus as claimed in claim 28 wherein said second sub-coil, as said amplifier coil, increases said predetermined gradient intensity.

* * * * *